United States Patent [19]
Higashide et al.

[11] Patent Number: 6,021,081
[45] Date of Patent: Feb. 1, 2000

[54] SEMICONDUCTOR MEMORY DEVICE HAVING STROBE BUFFER AND OUTPUT BUFFER

[75] Inventors: Yoshiko Higashide; Tomohisa Wada; Yutaka Arita, all of Hyogo, Japan

[73] Assignee: Mitsubishi Denki Kabushiki Kaisha, Tokyo, Japan

[21] Appl. No.: 09/195,461

[22] Filed: Nov. 18, 1998

[30] Foreign Application Priority Data

May 28, 1998 [JP] Japan .................................. 10-147156

[51] Int. Cl.$^7$ ........................................................ G11C 7/00
[52] U.S. Cl. ...................... 365/226; 365/189.09; 327/564
[58] Field of Search ........................ 365/226, 63, 189.09; 327/564, 566

[56] References Cited

U.S. PATENT DOCUMENTS

| | | | |
|---|---|---|---|
| 4,864,164 | 9/1989 | Ohshima et al. | 307/443 |
| 5,229,846 | 7/1993 | Kozuba | 257/678 |
| 5,760,643 | 6/1998 | Whetsel | 327/565 |

FOREIGN PATENT DOCUMENTS

| | | |
|---|---|---|
| 61-218153 | 9/1986 | Japan . |
| 1-042097 | 2/1989 | Japan . |
| 1-243578 | 9/1989 | Japan . |

*Primary Examiner*—David Nelms
*Assistant Examiner*—Hien Nguyen
*Attorney, Agent, or Firm*—McDermott, Will & Emery

[57] ABSTRACT

An output buffer is connected to a first power supply line and a first ground line, and a strobe buffer is connected to a second power supply line and a second ground line. The first power supply line is connected to a first pad, the first ground line is connected to a second pad, the second power supply line is connected to a third pad, and the second ground line is connected to a fourth pad, respectively. The first and second power supply lines are not connected inside the chip, and the first and second ground lines are not connected inside the chip. The first and third pads are separately connected to the respective lead terminals, and the second and fourth pads are separately connected to the respective lead terminals.

6 Claims, 5 Drawing Sheets

| EXTERNAL PIN | EXTERNAL PIN NUMBER | LEAD TERMINAL | PAD | POWER SUPPLY LINE OR GROUND LINE |
|---|---|---|---|---|
| VDDQ | 4 | F11 | P11 | V1 |
| | 20 | F12 | P12 | |
| | 27 | F13 | P13 | |
| | 11 | F3 | P3 | V3 |
| VSSQ | 5 | F21 | P21 | V2 |
| | 10 | F22 | P22 | |
| | 26 | F23 | P23 | |
| | 21 | F4 | P4 | V4 |

SEMICONDUCTOR MEMORY DEVICE HAVING STROBE BUFFER AND OUTPUT BUFFER

BACKGROUND OF THE INVENTION

1. Field of the Invention

The present invention relates to a semiconductor memory device, and more specifically to a semiconductor memory device having a strobe buffer and an output buffer.

2. Description of the Background Art

In a synchronous SRAM (Static Random Access Memory), a data signal is read from a memory cell to an output buffer in synchronism with the rise of a clock signal, and further is output from the output buffer to an external MPU (Main Processing Unit). Further, a timing signal referred to as a strobe signal is output from a strobe buffer to the external MPU in synchronism with the rise of an inverted signal of the clock signal. The logic level of the strobe signal changes from "H" (logic high) to "L" (logic low) to "H" to "L" and so on in synchronism with the rise of the inverted signal of the clock signal. The MPU takes in the data signal from the output buffer when the level of the strobe signal changes.

Normally, the time that passes from the rise of the clock signal to the time when the data signal is output by the output buffer is designed to equal the time that passes from the rise of the inverted signal of the clock signal to the time when the level of the strobe signal changes. Therefore, there is a time gap between the time when the level of the strobe signal changes and the time when the data signal output from the output buffer changes, the time gap being equal to the clock pulse width. As a result, the data signal is taken in by the MPU when the signal is most stable.

Normally, the data signal output from a synchronous SRAM contains multiple bits, causing a plurality of output buffers to operate at the same time. A large amount of electrical current flows at this time, and the electrical potentials of the power supply line and the ground line of the output buffers become unstable.

If a power supply line of an output buffer and a power supply line of a strobe buffer are connected, the instability of the electrical potential of the power supply line of the output buffer affects the electrical potential of the power supply line of the strobe buffer to become unstable as well. Moreover, if a ground line of an output buffer and a ground line of a strobe buffer are connected, the instability of the electrical potential of the ground line of the output buffer affects the electrical potential of the ground line of the strobe buffer to become unstable as well.

As a result, when a noise pulse appears on the strobe signal or when the level of the strobe signal changes before the noise pulse disappears, it becomes impossible to acknowledge the level changes of the strobe signal accurately, which leads to the problem of the MPU taking in the data signal at an inappropriate time.

SUMMARY OF THE INVENTION

The object of the present invention is to provide a semiconductor memory device with a strobe buffer which is not affected by the noise that is generated during the operation of the output buffer.

In accordance with one aspect of the present invention, the semiconductor memory device is provided with a memory, a first power supply line, an output buffer, a first pad, a first lead terminal, a second power supply line, a strobe buffer, a second pad, and a second lead terminal. The output buffer is connected to the first power supply line, reads a data signal from the memory, and outputs the data signal. The first pad is connected to the first power supply line. The first lead terminal is wired to the first pad. The strobe buffer is connected to the second power supply line and generates a strobe signal for the data signal. The second pad is connected to the second power supply line. The second lead terminal is wired to the second pad.

The first and the second power supply lines preferably receive a voltage equal to or higher than the ground voltage.

In the above-mentioned semiconductor memory device, the power supply for the output buffer is provided from the first pad through the first power supply line, and the power supply for the strobe buffer is provided from the second pad through the second power supply line. Further, the first pad, the first lead terminal, and the first power supply line are completely separated from the second pad, the second lead terminal, and the second power supply line. Therefore, when the electrical potential of the first power supply line becomes unstable due to the operation of the output buffer, the second power supply line is not affected.

Preferably, the above-mentioned semiconductor memory device further includes a third power supply line, a third pad, a third lead terminal, a fourth power supply line, a fourth pad, and a fourth lead terminal. The third power supply line is connected to the output buffer to receive the ground voltage. The third pad is connected to the third power supply line. The third lead terminal is wired to the third pad. The fourth power supply line is connected to the strobe buffer to receive the ground voltage. The fourth pad is connected to the fourth power supply line. The fourth lead terminal is wired to the fourth pad.

In the above-mentioned semiconductor memory device, the power supply for the output buffer is provided from the first pad through the first power supply line, and the power supply for the strobe buffer is provided from the second pad through the second power supply line. Moreover, the first pad, the first lead terminal, and the first power supply line are completely separated from the second pad, the second lead terminal, and the second power supply line. In addition, the ground voltage for the output buffer is supplied from the third pad through the third power supply line, and the ground voltage for the strobe buffer is supplied from the fourth pad through the fourth power supply line. Furthermore, the third pad, the third lead terminal, and the third power supply line are completely separated from the fourth pad, the fourth lead terminal, and the fourth power supply line. Thus, when the electrical potentials of the first power supply line and the third power supply line become unstable due to the operation of the output buffer, the second power supply line and fourth power supply line remain unaffected.

In accordance with another aspect of the present invention, the semiconductor memory device is provided with a grounded die pad and a die mounted on the die pad. The die includes a memory, a first ground line, an output buffer, and a first pad. The first ground line receives the ground voltage. The output buffer is connected to the first ground line, reads a data signal from the memory and outputs the data signal. The first pad is connected to the first ground line and is wired to the die pad.

In the above-mentioned semiconductor memory device, the first ground line is connected to the die pad via the first pad. Thus, the ground potential of the first ground line for the output buffer becomes stable.

Preferably, the die further includes a first power supply line, a second pad, a second lead terminal, a second ground line, a second power supply line, a strobe buffer, a third pad, a third lead terminal, a fourth pad, and a fourth lead terminal. The first power supply line, which receives a voltage higher than the ground voltage, is connected to the output buffer. The second pad is connected to the first power supply line. The second lead terminal is wired to the second pad. The second ground line receives the ground voltage. The second power supply line receives a voltage higher than the ground voltage. The strobe buffer is connected to the second ground line and the second power supply line and generates a strobe signal for the data signal. The third pad is connected to the second ground line. The third lead terminal is wired to the third pad. The fourth pad is connected to the second power supply line. The fourth lead terminal is wired to the fourth pad.

In the above-mentioned semiconductor memory device, the power supply for the output buffer is provided from the second pad through the first power supply line, and the power supply for the strobe buffer is provided from the fourth pad through the second power supply line. Moreover, the second pad, the second lead terminal, and the first power supply line are completely separated from the fourth pad, the fourth lead terminal, and the second power supply line. In addition, the ground voltage for the output buffer is supplied from the first pad through the first ground line, and the ground voltage for the strobe buffer is supplied from the third pad through the second ground line. Furthermore, the first pad, the first lead terminal, and the first ground line are completely separated from the third pad, the third lead terminal, and the second ground line. Therefore, when the electrical potentials of the first power supply line and the first ground line become unstable due to the operation of the output buffer, the second power supply line and the second ground line are not affected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
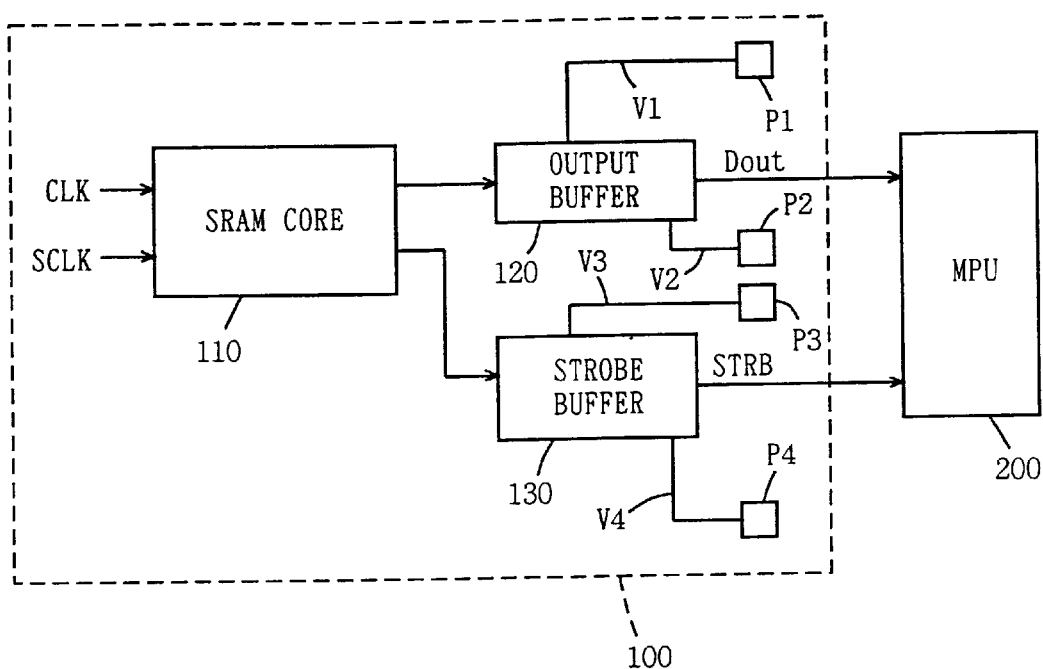
FIG. 1 is a block diagram showing the overall configuration of the synchronous SRAM according to the first embodiment of the present invention.

The embodiments of the present invention will be described below with reference to the drawings. Further, the same reference characters are used to indicate the same or corresponding parts throughout the drawings, and the description thereof will not be repeated.

First Embodiment

Figure 2:
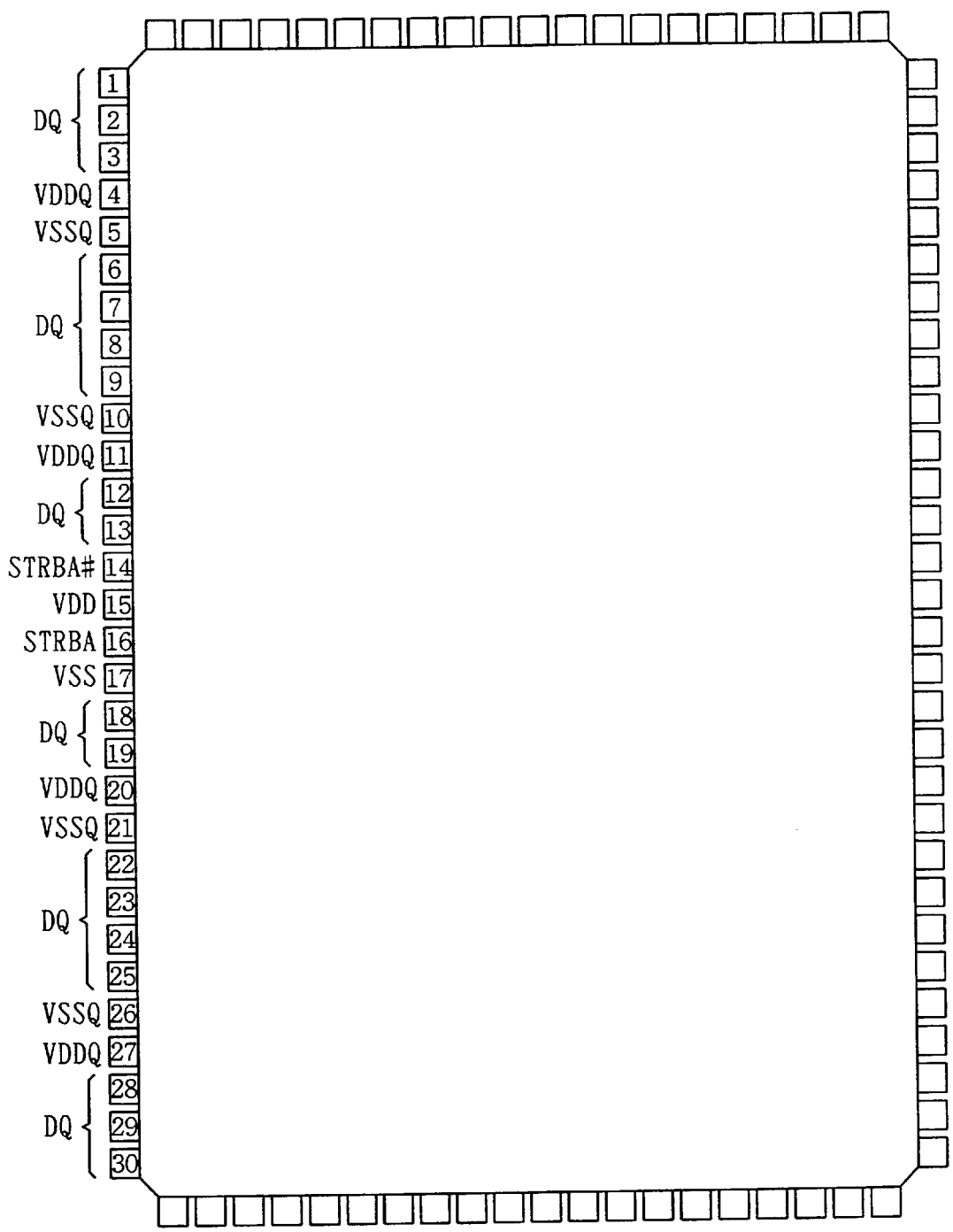
FIG. 2 depicts the arrangement of external pins for the synchronous SRAM package shown in FIG. 1.

FIG. 1 is a block diagram showing the overall configuration of the synchronous SRAM according to the first embodiment of the present invention. In FIG. 1, the synchronous SRAM is provided with a SRAM core 110, an output buffer 120, a strobe buffer 130, pads P1–P4, power supply lines V1 and V3, and ground lines V2 and V4 inside a package 100, and is connected externally to a MPU 200. SRAM core 110 includes a plurality of memory cells, a row decoder, and a column decoder (not shown) and receives a clock signal CLK and an inverted signal SCLK of the clock signal CLK. Output buffer 120 is provided corresponding to each bit of data signal Dout, is connected to power supply line V1 and ground line V2, and reads the multi-bit data signal Dout from the memory cells inside SRAM core 110 in synchronism with the rise of clock signal CLK to output the data signal. Strobe buffer 130 is connected to power supply line V3 and ground line V4 and outputs a strobe signal STRB. The logic level of strobe signal STRB changes from "H" (logic high) to "L" (logic low) to "H" to "L" and so on in synchronism with the rise of the inverted signal SCLK of clock signal CLK. A pad P1 is connected to power supply line V1 on the semiconductor substrate and is wired to the lead terminal (not shown) receiving the power supply voltage from outside package 100. A pad P2 is connected to ground line V2 on the semiconductor substrate and is wired to the lead terminal (not shown) receiving the ground voltage from outside package 100. A pad P3 is connected to power supply line V3 on the semiconductor substrate and is wired to the lead terminal (not shown) receiving the power supply voltage from outside package 100. A pad P4 is connected to ground line V4 on the semiconductor substrate and is wired to the lead terminal (not shown) receiving the ground voltage from outside package 100. Power supply line V1 is formed of metal and receives the power supply voltage from pad P1. Ground line V2 is formed of metal and receives the ground voltage from pad P2. Power supply line V3 is formed of metal and receives the power supply voltage from pad P3. Ground line V4 is formed of metal and receives the ground voltage from pad P4. FIG. 2 shows the arrangement of the external pins of the synchronous SRAM package 100 shown in FIG. 1. In package 100 in FIG. 2, pin numbers 1, 2, 3, 6, 7, 8, 9, 12, 13, 18, 19, 22, 23, 24, 25, 28, 29, 30 represent data input/output pins DQ, pin numbers 4, 11, 20, 27 represent power supply pins VDDQ, pin number 15 represents power supply pin VDD, pin numbers 5, 10, 21, 26 represent ground pins VSSQ, pin number 17 represents ground pin VSS, pin number 16 represents strobe signal output pin STRBA, and pin number 14 represents strobe signal output pin STRBA#. A data input/output pin DQ outputs data signal Dout output from output buffer 120 and receives the data signal from outside. Power supply pins VDDQ, VDD receive the power supply voltage from outside package 100. Ground pins VSSQ, VSS receive the ground voltage from outside package 100. Strobe signal output pins STRBA, STRBA# receive strobe signal STRB from strobe buffer 130. In addition, data output pins DQ and strobe signal output pins STRBA, STRBA# are connected to MPU 200.

Figures 3, 4:
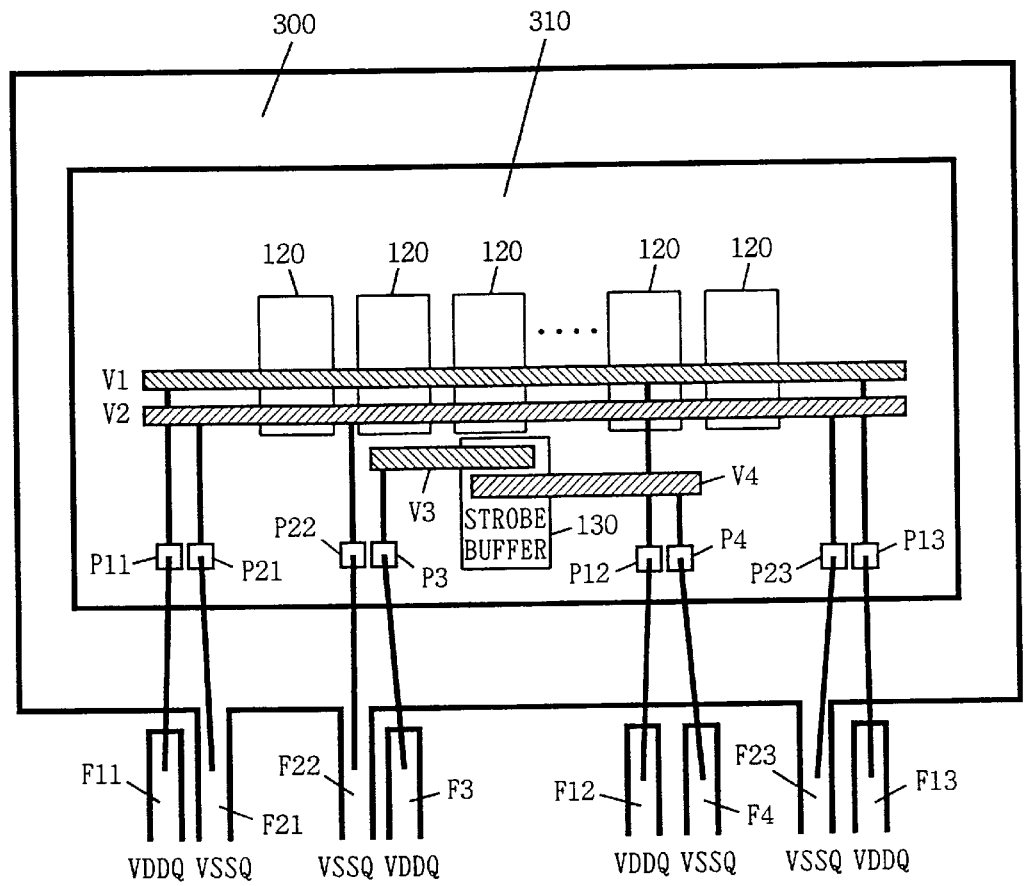
FIG. 3 represents in detail the internal arrangement of the synchronous SRAM package shown in FIG. 1.
FIG. 4 shows the connections among the external pins, the pin numbers, the lead terminals, the pads, the power supply lines, and the ground lines of the synchronous SRAM shown in FIG. 1.

FIG. 3 shows in detail the internal arrangement of the synchronous SRAM package 100 shown in FIG. 1. In FIG. 3, the synchronous SRAM package 100 is provided with lead terminals F11, F12, F13, F21, F22, F23, F3, and F4, a die pad 300, and a die 310 mounted on die pad 300.

FIG. 4 shows the connections among the external pins, the pin numbers, the lead terminals, the pads, the power supply lines, and the ground lines of the synchronous SRAM shown in FIG. 1. In FIG. 4, a lead terminal F11 is connected to a power supply pin VDDQ (pin number 4), a lead terminal F12 is connected to a power supply pin VDDQ (pin number 20), a lead terminal F13 is connected to a power supply pin VDDQ (pin number 27), a lead terminal F21 is connected to a ground pin VSSQ (pin number 5), a lead terminal F22 is connected to a ground pin VSSQ (pin number 10), a lead terminal F23 is connected to a ground pin VSSQ (pin number 26), a lead terminal F3 is connected to a power supply pin VDDQ (pin number 11), and a lead terminal F4 is connected to a ground pin VSSQ (pin number 21), respectively.

Die pad 300 is connected to lead terminals F21, F22, and F23.

Die 310 is provided with SRAM core 110 shown, in FIG. 1, output buffers 120, strobe buffer 130, power supply lines V1 and V3, ground lines V2 and V4, and pads P11, P12, P13, P21, P22, P23, P3, and P4. Pads P11, P12, and P13 are connected to power supply line V1 and pads P21, P22, P23 are connected to ground line V2.

In addition, lead terminal F11 is wired to pad P11, lead terminal F12 is wired to pad P12, lead terminal F13 is wired to pad P13, lead terminal F21 is wired to pad P21, lead terminal F22 is wired to pad P22, lead terminal F23 is wired to pad P23, lead terminal F3 is wired to pad P3, and lead terminal F4 is wired to pad P4, respectively.

As shown above, the circuitry where the power supply voltage is supplied from the external pin to power supply line V1 for output buffer 120 is separated from the circuitry where the power supply voltage is supplied from the external pin to power supply line V3 for strobe buffer 130. Moreover, the circuitry where the ground voltage is supplied from the external pin to ground line V2 for output buffer 120 is separated from the circuitry where the ground voltage is supplied from the external pin to ground line V4 for strobe buffer 130.

Figure 5:
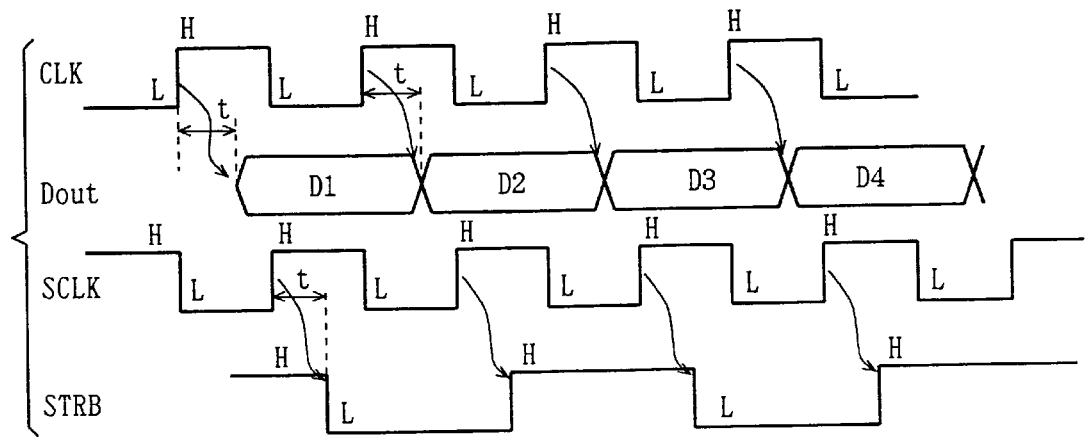
FIG. 5 is a timing diagram describing the operation of the synchronous SRAM according to the first embodiment of the present invention.

Now, the operation of the synchronous SRAM configured in the above described manner will be explained with reference to FIG. 5.

Data signal Dout output from output buffer 120 to MPU 200 switches from D1 to D2 to D3 to D4 and so on in synchronism with the rise of clock signal CLK after a fixed time t from the rise of clock signal CLK. Moreover, the logic level of strobe signal STRB output from strobe buffer 130 to MPU 200 changes from "H" to "L" to "H" to "L" and so on in synchronism with the rise of inverted signal SCLK of clock signal CLK after a fixed time t from the rise of inverted signal SCLK of clock signal CLK. MPU 200 acknowledges the change in the level of strobe signal STRB and takes in the data signal Dout when the level of strobe signal STRB changes from "H" level to "L" level and from "L" level to "H" level. Further, as is shown in FIG. 6, since the level change in strobe signal STRB occurs intermediate between the time when data signal Dout switches and the time when it switches next, MPU 200 takes in the data signal Dout in its stable condition.

At this time, a plurality of output buffers 120 operate at the same time, causing a large amount of current to flow through power supply line V1 and ground line V2. As a result, the electrical potentials of power supply line V1 and ground line V2 may become unstable.

Figure 6:
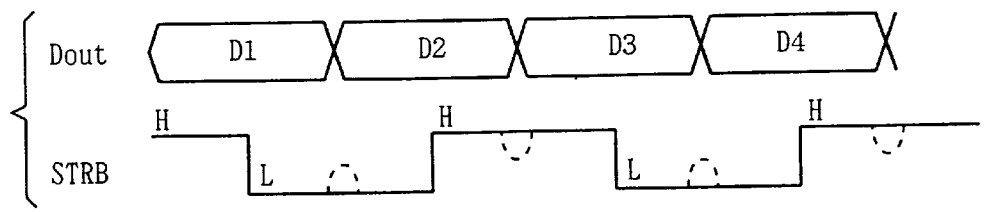
FIG. 6 is a timing diagram showing the relation between the data signal and the strobe signal shown in FIG. 5.

Under such circumstances, if there is a connection inside the chip where power supply lines V1 and V3 or ground lines V2 and V4 are connected to the same pad in the conventional manner, power supply line V3 or ground line V4 would be affected by power supply line V1 or ground line V2, and as is shown by the dotted line in FIG. 6, a noise occurs on strobe signal STRB when data signal Dout switches. MPU 200 may mistake this noise for the level change in strobe signal STRB and operate incorrectly.

Figure 7:
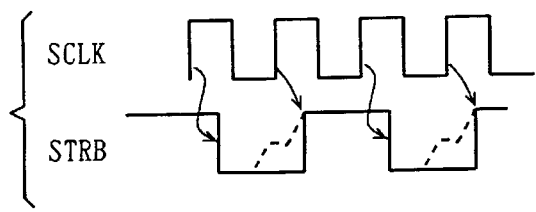
FIG. 7 is a timing diagram describing the operation of the synchronous SRAM at a high frequency.

Furthermore, as shown in FIG. 7, at a high frequency, that is when the period of change in clock signal CLK is short, the period of change in its inverted signal SCLK naturally is also short. Then, when a noise pulse appears on strobe signal STRB, the strobe signal may switch before the noise pulse disappears and the signal goes back to its original electrical potential. In such a case, the timing of the voltage change in strobe signal STRB is unclear, and MPU 200, failing to acknowledge the time accurately when the level of strobe signal STRB switches, may operate incorrectly.

If, in order to eliminate such an effect, power supply line V1 and power supply line V3, or ground line V2 and ground line V4 are respectively connected to separate pads but are still connected to the same external pins, a similar incorrect operation as described above of MPU 200 would occur through the lead terminals or the external pins.

However, in the first embodiment, power supply line V1 for output buffer 120 is connected to pads P1i (i=1 to 3), pads P1i (i=1 to 3) are connected to lead terminals F1i (i=1 to 3), power supply line V3 for strobe buffer 130 is connected to pad P3, and pad P3 is connected to lead terminal F3. Moreover, ground line V2 for output buffer 120 is connected to pads P2i (i=1 to 3), pads P2i (i=1 to 3) are connected to lead terminals F2i (i=1 to 3), ground line V4 for strobe buffer 130 is connected to pad P4, and pad P4 is connected to lead terminal F4. Thus, power supply line V1 for output buffer 120 and power supply line V3 for strobe buffer 130 as well as ground line V2 for output buffer 120 and ground line V4 for strobe buffer 130 are completely separated from the external pins. Furthermore, normally a multi-layer substrate is utilized outside the synchronous SRAM package 100, which brings about a very stable power supply potential and a ground potential.

Therefore, when the electrical potentials of power supply line V1 and ground line V2 become unstable due to the operation of output buffer 120, power supply line V3 and ground line V4 remain unaffected, and the possibility of MPU 200 operating incorrectly is greatly reduced.

In addition, since part of data input/output pins VDDQ and ground pins VSSQ for output buffer 120 are assigned as pins for strobe buffer 130 (pin number 11, 21), there is no need to provide additional external pins. Thus, the synchronous SRAM of the present invention is compatible with prior art in that the same package may be used and that the arrangement of the external pins need not be modified.

Although two pins, one from data input/output pins VDDQ and one from ground pins VSSQ respectively are assigned for strobe buffer 130 in this example, more than two pins may be assigned.

Further, although the data input/output pin VDDQ (pin number 11) is assigned to strobe buffer 130 in this example, any one of data input/output pins VDDQ may be assigned.

In addition, the metal interconnection from power supply lines V1, V3 and ground lines V2, V4 to pads P1–P4 may utilize any layer of metal. The interconnection may utilize a single layer or two or more layers of metal. The interconnection may be non-metal. Moreover, as to strobe buffer 130 and strobe signal STRB, any timing output buffer and any strobe signal other than strobe buffer 130 and strobe signal STRB may be used.

Second Embodiment

Figure 8:
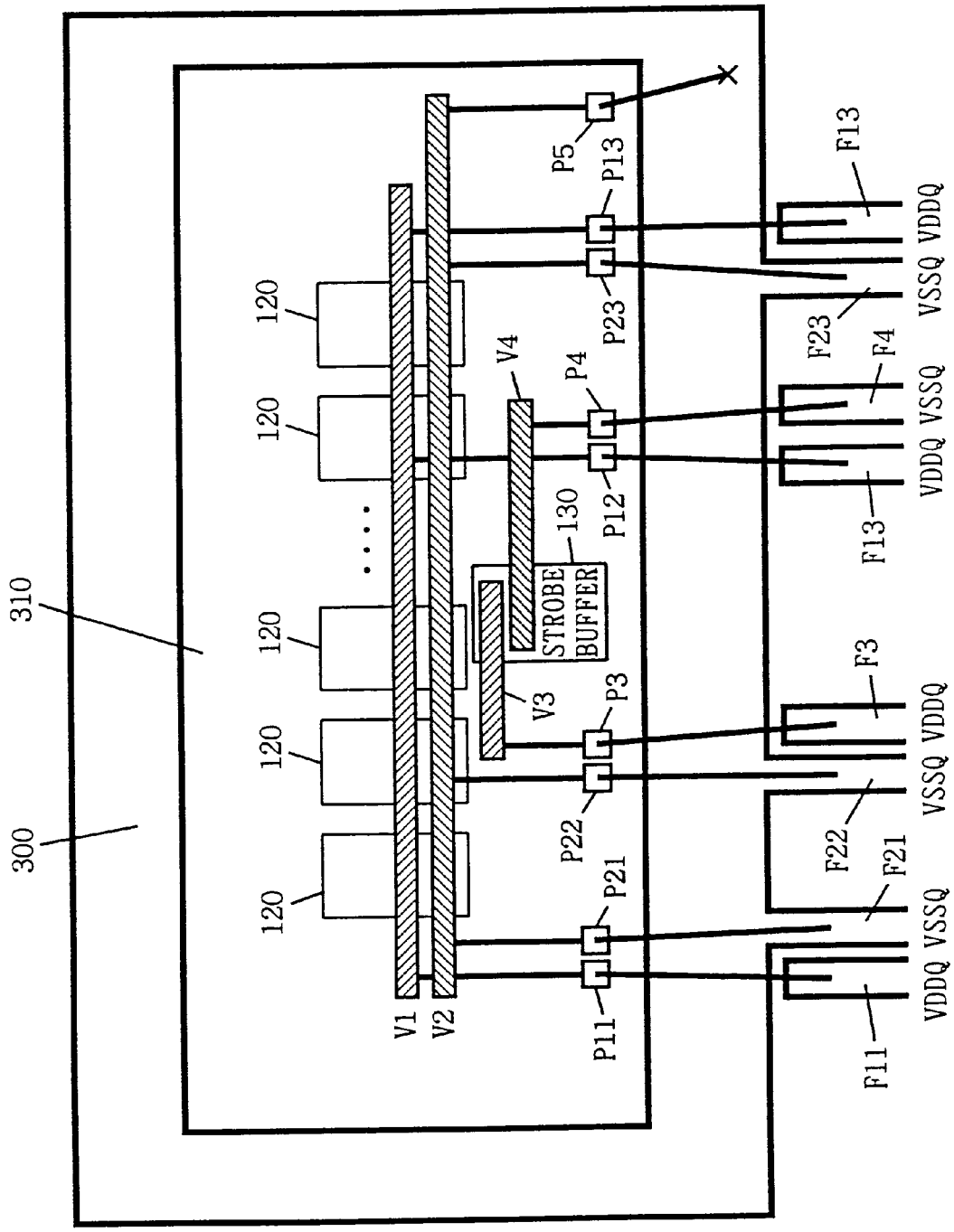
FIG. 8 represents the internal arrangement of the synchronous SRAM according to the second embodiment of the present invention.

FIG. 8 shows the internal arrangement of the synchronous SRAM according to the second embodiment of the present invention. In FIG. 8, the synchronous SRAM is provided with a pad P5 in addition to the arrangement shown in FIG. 3. Pad P5 is connected on the semiconductor substrate to ground line V2 for output buffer 120 and is wired to a die pad 300.

Die pad 300 is connected to lead terminals F21, F22, F23 and is grounded. Thus, ground line V2 for output buffer 120 is connected to the grounded die pad 300 via pad P5. Since die pad 300 has a large parasitic capacitance, the ground potential of ground line V2 for output buffer 120 becomes stable.

As described above, in the second embodiment, with pad P5 connected by metal to ground line V2 for output buffer 120 and wired to die pad 300, when output buffers 120 operate all at once, the ground potential of ground line V2 does not easily become unstable, and the generation of noise on ground line V2 for output buffer 120 becomes less likely to occur. Moreover, when the noise is generated on ground line V2 for output buffer 120, this noise is less likely to be propagated to ground line V4 for strobe buffer 130. Consequently, the possibility of the noise occurring on strobe signal STRB is reduced, and the incorrect operation of MPU 200 becomes less likely.

In addition, it is preferred that the wire connecting pad P5 and die pad 300 is about the same length as the wire connecting other pads and lead terminals for the following reason. That is, after the wiling step, as the mold resin is poured over the wires, the wires are somewhat pushed aside by the resin, and if the length of the wire connecting pad P5 and die pad 300 is much shorter than the length of the wires connecting other pads with other lead terminals, the amount which the wires are pushed aside would differ greatly, possibly causing a short circuit between the short wire and an adjacent wire.

Moreover, although one pad P5 is provided in this example, a plurality of pads like pad P5 may be provided. In addition, any number of wires may be used to connect pad P5 and die pad 300. Pad P5 may further be wired to lead terminals F2i (i=1 to 3). Furthermore, the metal interconnection between ground line V2 and pad P5 may utilize any layer of metal. The interconnection may utilize one or more than one layer of metal. In addition, the interconnection may be non-metal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory;
   a first power supply line;
   an output buffer connected to said first power supply line for outputting a data signal read from said memory;
   a first pad connected to said first power supply line;
   a first lead terminal wired to said first pad;
   a second power supply line;
   a strobe buffer connected to said second power supply line for generating a strobe signal for said data signal;
   a second pad connected to said second power supply line; and
   a second lead terminal wired to said second pad.

2. The semiconductor memory device according to claim 1, wherein said first and second power supply lines receive a voltage higher than a ground voltage.

3. The semiconductor memory device according to claim 1, wherein said first and second power supply lines receive a ground voltage.

4. The semiconductor memory device according to claim 2, further comprising:
   a third power supply line connected to said output buffer for receiving the ground voltage;
   a third pad connected to said third power supply line;
   a third lead terminal wired to said third pad;
   a fourth power supply line connected to said strobe buffer for receiving the ground voltage;
   a fourth pad connected to said fourth power supply line; and
   a fourth lead terminal wired to said fourth pad.

5. A semiconductor memory device, comprising:
   a grounded die pad; and
   a die mounted on said die pad,
   said die including:
   a memory,
   a first ground line for receiving a ground voltage,
   an output buffer connected to said first ground line for outputting a data signal read from said memory, and
   a first pad connected to said first ground line and wired to said die pad.

6. The semiconductor memory device according to claim 5, wherein said die further includes:
   a first power supply line connected to said output buffer for receiving a voltage higher than the ground voltage;
   a second pad connected to said first power supply line;
   a second lead terminal wired to said second pad;
   a second ground line for receiving the ground voltage;
   a second power supply line for receiving a voltage higher than the ground voltage;
   a strobe buffer connected to said second ground line and said second power supply line for generating a strobe signal for said data signal;
   a third pad connected to said second ground line;
   a third lead terminal wired to said third pad;
   a fourth pad connected to said second power supply line; and
   a fourth lead terminal wired to said fourth pad.

* * * * *